(12) United States Patent
Narita

(10) Patent No.: US 12,690,240 B2
(45) Date of Patent: Jul. 21, 2026

(54) MULTILAYERED SUBSTRATE

(71) Applicant: SUMITOMO CHEMICAL COMPANY, LIMITED, Tokyo (JP)

(72) Inventor: Yoshinobu Narita, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 350 days.

(21) Appl. No.: 18/618,394

(22) Filed: Mar. 27, 2024

(65) Prior Publication Data

US 2024/0339492 A1      Oct. 10, 2024

(30) Foreign Application Priority Data

Apr. 6, 2023      (JP) ................................. 2023-062139

(51) Int. Cl.
H10D 62/10 (2025.01)
H10D 62/85 (2025.01)
H10D 62/854 (2025.01)

(52) U.S. Cl.
CPC ......... H10D 62/10 (2025.01); H10D 62/8503 (2025.01); H10D 62/854 (2025.01)

(58) Field of Classification Search
None
See application file for complete search history.

(56) References Cited

U.S. PATENT DOCUMENTS

| | | | | |
|---|---|---|---|---|
| 2015/0243736 A1* | 8/2015 | Kaneda | .............. | H10D 62/8503 |
| | | | | 438/478 |
| 2017/0365700 A1* | 12/2017 | Beam, III | ............ | H10D 30/475 |
| 2020/0208297 A1 | 7/2020 | Horikiri et al. | | |
| 2020/0255979 A1* | 8/2020 | Yoshizumi | ............ | C30B 29/406 |
| 2020/0373153 A1* | 11/2020 | Chang | ................. | H10P 14/2905 |

FOREIGN PATENT DOCUMENTS

JP      2018-199601 A      12/2018

* cited by examiner

*Primary Examiner* — Michelle Mandala
(74) *Attorney, Agent, or Firm* — Birch, Stewart, Kolasch & Birch, LLP

(57) ABSTRACT

A multilayered substrate comprises: an underlying substrate; and a gallium nitride layer epitaxially grown above the underlying substrate and comprising gallium nitride containing silicon; the gallium nitride layer having a top surface with a radius of 50 mm or more, the gallium nitride layer having a thickness of 4 $\mu$m or more, wherein a silicon concentration on the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and an outer circumferential silicon contamination concentration, which is an excess of the outer circumferential silicon concentration from the central silicon concentration, is $1.2 \times 10^{15}$ cm$^{-3}$ or less.

3 Claims, 5 Drawing Sheets

100

MULTILAYERED SUBSTRATE

TECHNICAL FIELD

The present invention relates to a multilayered substrate.

DESCRIPTION OF RELATED ART

A multilayered substrate, in which a gallium nitride (GaN) layer is epitaxially grown on various underlying substrates, is used as a material for manufacturing a semiconductor device (for example, see Patent Literature 1). In order to improve production efficiency of the semiconductor device, a diameter of the multilayered substrate is being increased. Silicon (Si) is used as an n-type impurity added to a GaN layer.

As detailed later, when considering the multilayered substrate with a large diameter, a low doped Si concentration, and a thick GaN layer, the inventor of the present application found that in-plane non-uniformity (specifically, non-uniformity in which the Si concentration increases on the outer circumferential side of the GaN layer) is likely to occur in a Si concentration distribution in the GaN layer.

Patent Literature 1: Japanese Patent Application Publication No. 2018-199601

SUMMARY OF THE INVENTION

One object of the present invention is to provide a multilayered substrate in which in-plane non-uniformity of a Si concentration distribution in a GaN layer is suppressed.

According to one aspect of the present invention, there is provided a multilayered substrate, including:

an underlying substrate; and a gallium nitride layer epitaxially grown above the underlying substrate and comprising gallium nitride containing silicon;

the gallium nitride layer having a top surface with a radius of 50 mm or more, the gallium nitride layer having a thickness of 4 μm or more, wherein a silicon concentration on the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and an outer circumferential silicon contamination concentration, which is an excess of the outer circumferential Silicon concentration from the central Silicon concentration, is $1.2 \times 10^{15}$ cm$^{-3}$ or less (preferably $0.9 \times 10^{15}$ cm$^{-3}$ or less, more preferably $0.6 \times 10^{15}$ cm$^{-3}$ or less).

There is provided a multilayered substrate in which in-plane non-uniformity of a Si concentration distribution in a GaN layer is suppressed.

DETAILED DESCRIPTION OF THE INVENTION

Figure 1:
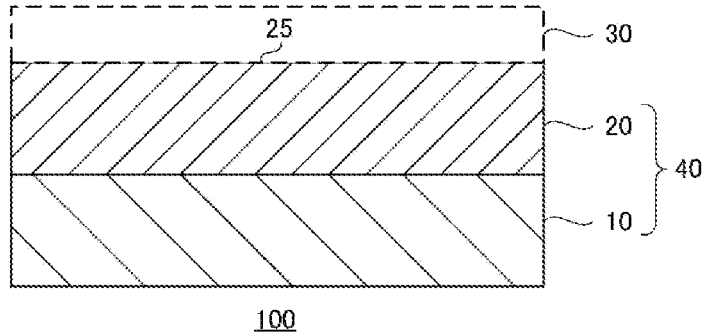
FIG. 1 is a schematic cross-sectional view illustrating a multilayered substrate according to an embodiment.

A multilayered substrate 100 according to an embodiment of the present invention will be described. FIG. 1 is a schematic cross-sectional view illustrating the multilayered substrate 100. The multilayered substrate 100 includes at least an underlying structure 10 and a gallium nitride (GaN) layer 20 formed on underlying structure 10.

The underlying structure 10 has at least an underlying substrate that is a crystal substrate on which the GaN layer 20 is epitaxially grown. The underlying structure 10 may have a buffer layer between the underlying substrate and the GaN layer 20, if necessary. The structure of the buffer layer may be appropriately selected as appropriate.

As the underlying substrate, a GaN substrate, a sapphire substrate, a silicon (Si) substrate, a silicon carbide (SiC) substrate, etc., may be used as appropriate. For example, when the underlying substrate is a GaN substrate, the underlying structure 10 may be a GaN substrate. Further, for example, when the underlying substrate is a Si substrate, the underlying structure 10 may include a Si substrate, an aluminum nitride (AlN) layer provided as a nucleation layer, and the like.

The multilayered substrate 100 may have an upper layer 30 formed on the GaN layer 20, if necessary. The structure of the upper layer 30 may be selected as appropriate depending on an operation of a semiconductor device desired to be manufactured using the multilayered substrate 100. The upper layer 30 may be, for example, a III-nitride layer epitaxially grown on the GaN layer 20.

The GaN layer 20 according to an embodiment has characteristics as described below. The GaN layer 20 has a top surface 25 with a radius of 50 mm or more (diameter of 100 mm or more). That is, the multilayered substrate 100 has a circular shape with a diameter of 100 mm or more. The multilayered substrate 100 may have an orientation flat or a notch if necessary.

The GaN layer 20 contains silicon (Si) as an n-type impurity. The Si concentration in the top surface 25 of the GaN layer 20 has a distribution in which an outer circumferential Si concentration C1 at the outer circumference of the top surface 25 is higher than a central Si concentration C0 at the center of the top surface 25.

The central Si concentration C0 is a low concentration that is affected by a concentration fluctuation of $10^{15}$ cm$^{-3}$ order, and specifically is $4 \times 10^{15}$ cm$^{-3}$ or more and less than $2 \times 10^{16}$ cm$^{-3}$. Such an effect is more significant in an embodiment where the central Si concentration C0 is less than $1 \times 10^{16}$ cm$^{-3}$ (that is, $10^{15}$ cm$^{-3}$ order). An outer circumferential Si contamination concentration $\Delta$ (that is, C1–C0), which is the excess of the outer circumferential Si concentration C1 from the central Si concentration C0, is $1.2 \times 10^{15}$ cm$^{-3}$ or less. That is, although the outer circumferential Si concentration C1 is higher than the central Si concentration C0, the outer circumferential Si contamination concentration $\Delta$, which is a difference between the two, is suppressed to $1.2 \times 10^{15}$ cm$^{-3}$ or less so as not to become excessively high. The thickness of the GaN layer 20 is 4 μm or more. Further, the thickness of the GaN layer 20 is, for example, 40 μm or less.

The GaN layer 20 is a layer that functions as at least a part of an active layer in a semiconductor device including the multilayered substrate 100. Therefore, it is preferable that the GaN layer 20 has both breakdown voltage property and resistance property in a well-balanced manner. From a viewpoint of improving the breakdown voltage, the central Si concentration C0 of the GaN layer 20 is preferably less than $2 \times 10^{16}$ cm$^{-3}$. Also, from the viewpoint of improving the breakdown voltage, the thickness of the GaN layer 20 is preferably 4 μm or more. From a viewpoint of reducing resistance, the central Si concentration C0 of the GaN layer 20 is preferably $4 \times 10^{15}$ cm$^{-3}$ or more. Also, from the viewpoint of reducing resistance, the thickness of the GaN layer 20 is preferably 40 μm or less.

As detailed later, the outer circumferential Si contamination concentration $\Delta$ is the concentration of Si mixed into the outer circumference of the GaN layer 20 resulting from a Si-containing deposition 230. The central Si concentration C0 is approximately equal to a target Si doping concentration, which is an intentionally added Si concentration. The outer circumferential Si contamination concentration $\Delta$ is an excess amount at the outer circumference, resulting from the Si mixed from the central Si concentration C0. The GaN layer 20 according to an embodiment is characterized in that the outer circumferential Si concentration $\Delta$ is suppressed compared to a comparative embodiment.

The following description shows an embodiment in which the radius of the GaN layer 20 is 50 mm, the thickness of the GaN layer 20 is 4 μm, and the target Si doping concentration in the GaN layer 20 is $9 \times 10^{15}$ cm$^{-3}$. Such conditions are common to the embodiment and the comparative embodiment.

Figure 2:
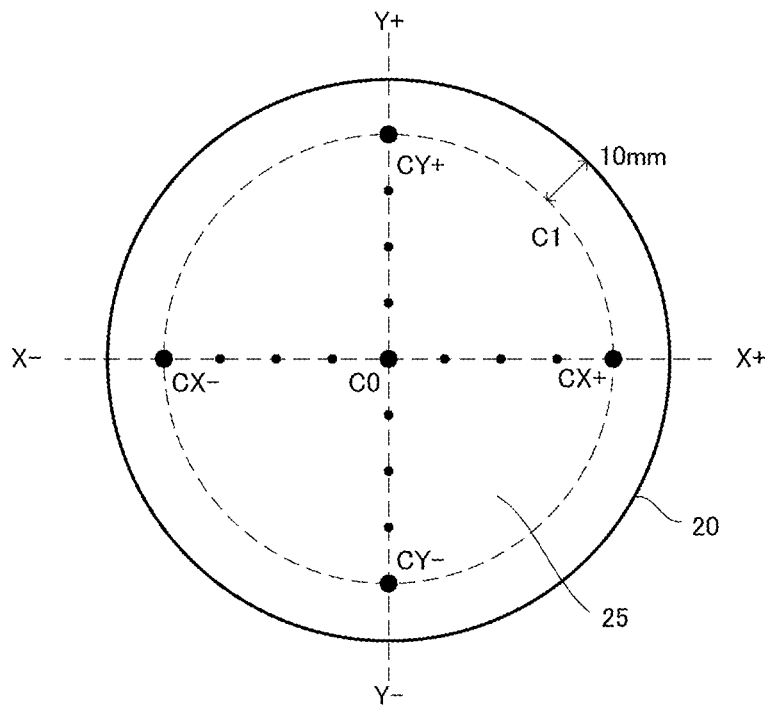
FIG. 2 is a top view of a GaN layer for explaining how to measure a Si concentration in the GaN layer.

A method of measuring the Si concentration in the GaN layer 20 will be explained. FIG. 2 is a top view of the GaN layer 20 for explaining how to measure the Si concentration in the GaN layer 20. An XY orthogonal coordinate system is set on the top surface 25 of the GaN layer 20, with a center of the top surface 25 as an origin.

First, an in-plane measurement position will be explained. At least five measurement points: a center measurement point and four outer circumferential measurement points are set as measurement points for Si concentration in the top surface 25. The center measurement point is set at the center of the top surface 25. The four outer circumferential measurement points are set at radial positions of 10 mm from the edge of the top surface 25 in each of the X positive direction, X negative direction, Y positive direction, and Y negative direction (that is, every 90° in the circumferential direction).

Here, when defining the Si concentration on the outer circumference of the top surface 25, a radial position of 10 mm from the edge of the top surface 25 is set as a representative position on the outer circumference.

The Si concentration at the center measurement point is the central Si concentration C0. The Si concentration that is an average of the Si concentration CX+ at the outer circumferential measurement point in the positive X direction, the Si concentration CX– at the outer circumferential measurement point in the negative X direction, the Si concentration CY+ at the outer circumferential measurement point in the Y positive direction, and the Si concentration CY– at the outer circumferential measurement point in the negative Y direction, is the outer circumferential Si concentration C1. That is, the outer circumferential Si concentration C1 indicates the Si concentration averaged in the circumferential direction on the outer circumference. The excess of the outer circumferential Si concentration C1 from the central Si concentration C0, ie, C1–C0, is the outer circumferential Si contamination concentration $\Delta$.

In this example, the radius of the top surface 25 is 50 mm. The four outer circumferential measurement points are set at radial positions of 40 mm from the center in each of the X positive direction, the X negative direction, the Y positive direction, and the Y negative direction.

In addition to the central measurement point and the four outer circumferential measurement points, an intermediate measurement point may be set at a radial position intermediate between the central measurement point and the outer circumferential measurement point. In this example, intermediate measurement points are set at radial positions 10 mm, 20 mm, and 30 mm from the center in the X positive direction, the X negative direction, the Y positive direction, and the Y negative direction, respectively. In FIG. 2, for ease of illustration, the central measurement point and the outer circumferential measurement points are shown as large black circles, and the intermediate measurement points are shown as small black circles.

Also in the embodiment in which the radius of the top surface 25 of the GaN layer 20 is more than 50 mm, the four outer circumferential measurement points are set at radial positions 10 mm from the edge of the top surface 25. Also in the embodiment in which the radius of the top surface 25 of the GaN layer 20 is more than 50 mm, the intermediate measurement points may be set at radial positions every 10 mm from the center in each of the X positive direction, the X negative direction, the Y positive direction, and the Y negative direction.

The Si concentration, which is the average of the Si concentrations at four measurement points in the X positive direction, the X negative direction, the Y positive direction, and the Y negative direction, which are set at equal radial positions from the center of the top surface 25, that is, the Si concentration averaged in the circumferential direction at each radial position is called an average Si concentration. The outer circumference Si concentration C1 is the average Si concentration on the outer circumference.

As will be described later, the growth of the GaN layer 20 is performed so as to be uniform in the circumferential direction. However, actually, variation in the Si concentration occurs even among the four measurement points set at equal radial positions. In order to reduce the effect of such a variation, the radial distribution of the Si concentration in the GaN layer 20 is evaluated using the average Si concentration, which is the Si concentration averaged in the circumferential direction. The concentration of the mixed Si is the excess of the average Si concentration from the central Si concentration C0 at each position in the radial direction.

Next, the measurement position in a height direction will be explained. As the Si concentration in the GaN layer 20, the Si concentration in the top surface 25 is measured by secondary ion mass spectrometry (SIMS). However, the "Si concentration in the top surface 25" does not mean the Si concentration exactly at the height of the top surface 25, but means the Si concentration near the top surface 25, as explained below. The top surface 25 is the uppermost surface of the multilayered substrate 100 in an embodiment in which the upper layer 30 is not laminated, and an interface between the upper layer 30 and the GaN layer 20 in an embodiment in which the upper layer 30 is laminated.

In general, SIMS measurement at a surface location is not reliable. Therefore, it is preferable to perform the SIMS measurement at a height slightly on the side of the underlying structure 10 from the top surface 25, that is, slightly on the inside of the GaN layer 20. Further, it is preferable to use a measured value averaged over a certain height range (depth range, thickness range). Here, for each in-plane measurement point, an average value of SIMS measurement values in a depth range of 100 nm or more and 200 nm or less from the top surface 25 is defined as the Si concentration in the top surface 25. For example, in an embodiment in which the thickness of the GaN layer 20 is 4 $\mu$m, the average value of the Si concentration measured by SIMS in a height range of 3.8 $\mu$m or more and 3.9 $\mu$m or less from the lower surface of the GaN layer 20 is defined as the Si concentration in the top surface 25.

Figure 8:
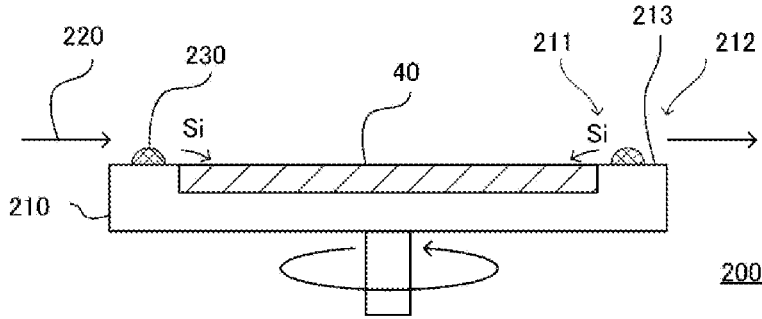
FIG. 8 is a schematic side view illustrating an apparatus for manufacturing the GaN layer according to a comparative embodiment.

Before further describing the embodiment, a comparative embodiment will be described. FIG. 8 is a schematic side view illustrating an apparatus 200 for manufacturing the GaN layer 20 according to a comparative embodiment. The manufacturing apparatus 200 is a metal organic vapor phase epitaxy (MOVPE) apparatus including a susceptor 210 on which a wafer 40 is placed. The wafer 40 is an object to be processed (an intermediate body of the multilayered substrate 100) at a stage where the growth process of the GaN layer 20 is performed by the manufacturing apparatus 200, and specifically is the underlying structure 10 when the growth of the GaN layer 20 starts and is a multilayered body of the underlying structure 10 and the GaN layer 20 after the growth of the GaN layer 20 starts.

The manufacturing apparatus 200 is a horizontal flow type MOVPE apparatus in which a source gas 220 is supplied in a direction parallel to the upper surface of the wafer 40. The source gas 220 includes GaN source gas for growing GaN constituting the GaN layer 20 and Si doping source gas for supplying Si to be added to the GaN layer 20. The GaN source gas includes gallium (Ga) source gas and nitrogen (N) source gas, and as the Ga source gas, for example, trimethyl gallium (TMG) gas is used, and as the N source gas, for example, ammonia (NH$_3$) gas is used. As the Si doping source gas, for example, silane (SiH$_4$) gas is used.

A growth temperature can be selected, for example, in a range of 900° C. to 1400° C., and the V/III ratio, which is the flow rate ratio of the group V source gas to the group III source gas, can be selected in a range of 10 to 5,000, for example. The Si doping source gas is supplied so that a target doping concentration in the GaN layer 20 is a specified value within a range of 4×10$^{15}$ cm$^{-3}$ or more and less than 2×10$^{16}$ cm$^{-3}$, for example, 9×10$^{15}$ cm$^{-3}$.

The susceptor 210 holds the wafer 40 so as to rotate the wafer 40 with the center of the wafer 40 as the center of rotation. By growing the GaN layer 20 while performing such a rotation, the growth conditions for the GaN layer 20 can be made uniform in the circumferential direction of the wafer 40.

A susceptor inner circumferential edge 211 is a position on the susceptor 210 where the edge of the wafer 40 is arranged in plan view. A susceptor edge upper surface 213 is an upper surface of the susceptor 210 between the susceptor inner circumferential edge 211 and a susceptor outer circumferential edge 212.

During the growth process of the GaN layer 20, Si is mixed into the GaN layer 20 from the Si-containing deposition 230, due to the deposition of the Si-containing deposition 230 on the susceptor edge upper surface 213. The Si-containing deposition 230 is a GaN waste and contains Si. It is presumed that the main source of the Si contained in the Si-containing deposition 230 is Ga source gas or Si doping source gas (one or both of these), but the details are unknown. Further, it is also not practical to avoid deposition of the Si-containing deposition 230 on the susceptor edge upper surface 213. The contamination of Si in the GaN layer 20 from the Si-containing deposition 230 cannot be controlled by a conventional technique.

The concentration of Si mixed from the Si-containing deposition 230 becomes higher at a position closer to the susceptor inner circumferential edge 211, that is, at a position closer to the outer circumferential side near the edge of the wafer 40. The containing Si in the GaN layer 20 resulting from the Si-containing deposition 230 is called a "contamination" (mixing), and is distinguished from "doping" (adding) which is intentionally causing the GaN layer 20 to contain Si using the Si-doping source gas.

It is ideal that the concentration of Si contained in the GaN layer 20 is controlled to a target doping concentration desired to be added using the Si doping source gas over an entire area of the top surface 25. Accordingly, as will be explained in the embodiment below, it is preferable to reduce the amount of Si mixed from the Si-containing deposition 230 as much as possible.

The concentration of Si mixed into the GaN layer 20 from the Si-containing deposition 230 is approximately the same in a growth within a range of the growth conditions described above and in a growth within a range of the target doping concentration described above. Specifically, as will be described below, the concentration of the mixed Si on the outer circumference (a radial position 10 mm from the edge of the wafer 40, and a radial position 10 mm from the susceptor inner circumferential edge 211 in the comparative embodiment) is approximately 1.6×10$^{15}$ cm$^{-3}$.

Figure 9:
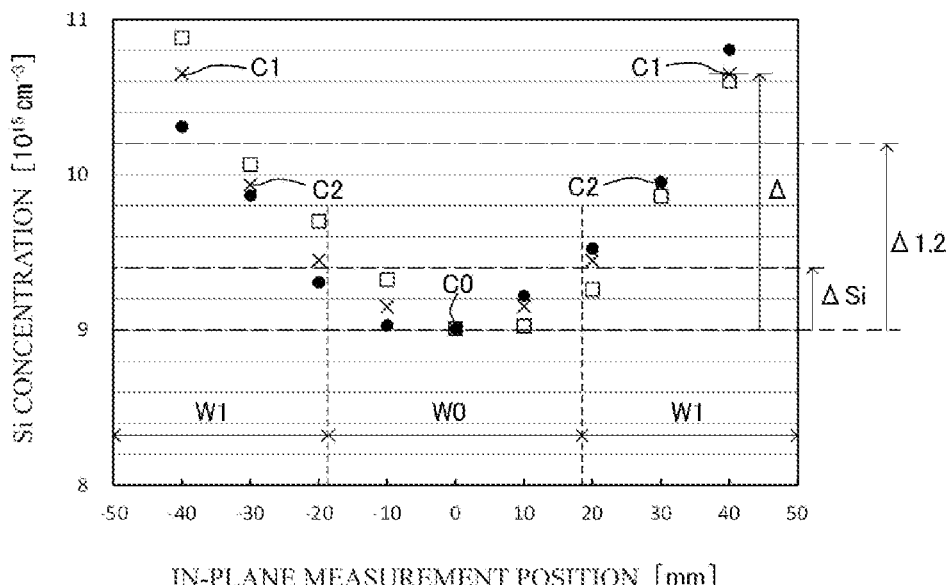
FIG. 9 is a graph showing an example of the Si concentration distribution in the top surface of the GaN layer according to a comparative embodiment.

FIG. 9 is a graph showing one example of the Si concentration distribution in the top surface 25 of the GaN layer 20 according to a comparative embodiment. The horizontal axis shows the in-plane measurement position in units of mm, and the vertical axis shows the Si concentration in units of 10$^{15}$ cm$^{-3}$. The Si concentration at each measurement point in the X direction is indicated by a black circle, and the Si concentration at each measurement point in the Y direction is indicated by an open square. An average Si concentration is indicated by a cross. Such a manner of display is also the same for the graphs of FIGS. 4 and 6 according to the embodiment.

The central Si concentration C0 is approximately equal to the target doping concentration of 9×10$^{15}$ cm$^{-3}$, and the Si concentration is almost constant up to about 10 mm from the center. From this reason, it can be said that the contamination of Si has not reached the center of the wafer 40.

At a radial position that is about 20 mm or more away from the center, the concentration of the mixed Si, which is the excess from the central Si concentration C0, increases significantly. Further, the concentration of the mixed Si increases toward the outer circumference.

In the comparative embodiment, the central Si concentration C0 is $9.01 \times 10^{15}$ cm$^{-3}$. The outer circumferential Si concentration C1 is $10.65 \times 10^{15}$ cm$^{-3}$. The outer circumferential Si contamination concentration $\Delta$ is $1.64 \times 10^{15}$ cm$^{-3}$.

Figure 10:
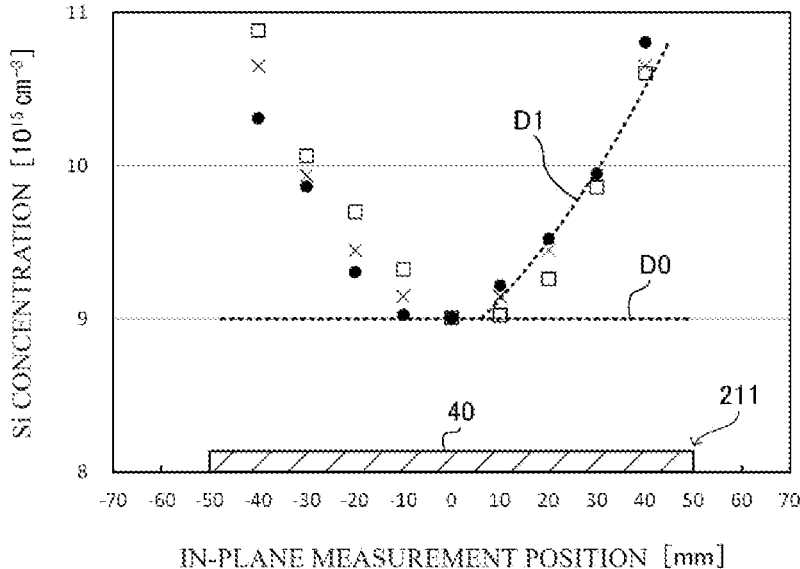
FIG. 10 is a graph schematically showing the Si concentration distribution according to a comparative embodiment, similar to FIG. 9.

FIG. 10 is a graph schematically showing the Si concentration distribution in the comparative embodiment, similar to FIG. 9. In order to facilitate understanding, FIG. 10 shows the wafer 40 and the susceptor inner circumferential edge 211 along with the Si concentration distribution.

The doping distribution DO is a constant Si concentration distribution that is equal to the central Si concentration C0 over an entire in-plane area of the wafer 40, and schematically shows the Si concentration distribution resulting from Si doped by the Si doping source gas. The contamination distribution D1 schematically shows the Si concentration distribution resulting from Si mixed from the Si-containing deposition 230. An entire Si concentration distribution is expressed as the sum of the doping distribution DO and the contamination distribution D1.

Si resulting from the Si-containing deposition 230 is mixed from the edge of the wafer 40 up to a width of about 40 mm in a radial direction. In the wafer 40 of this example having a large diameter, for example, a radius of 50 mm, as in this example, contamination of Si does not occur at the center. In contrast, when assuming an embodiment using a wafer with a smaller diameter, for example, a radius of 25 mm, contamination of Si will occur in even at the center of the wafer.

In a small-diameter embodiment to cause contamination of Si at the center, the Si mixed from both edges sandwiching the center is superimposed at the center. Therefore the Si concentration resulting from the mixed Si becomes high also at the center. As a result, the Si concentration distribution resulting from the mixed Si approaches in-plane uniformity.

In contrast, as in the case of this example, in a large-diameter embodiment that avoid the contamination of Si at the center, the Si concentration distribution resulting from the mixed Si becomes a non-uniform distribution with a large difference between the center and the outer circumference. As described above, in the wafer 40 with a large diameter, specifically, a radius of 50 mm or more, the in-plane non-uniformity of the Si concentration distribution resulting from the mixed Si becomes significant.

Although 50 mm radius embodiment is shown, even in the wafer 40 with a radius of more than 50 mm, the concentration of mixed Si on the outer circumference (a radial position 10 mm from the edge of the wafer 40, and a radial position 10 mm from the susceptor inner circumferential edge 211 in the comparative embodiment) is approximately the same as in the case of a radius of 50 mm.

In the comparative embodiment, the outer circumferential Si contamination concentration $\Delta$, which is a difference of the Si concentration between the center and the outer circumference, is $1.64 \times 10^{15}$ cm$^{-3}$. On the other hand, a target Si doping concentration, that is, the central Si concentration C0, is such a low concentration that is affected by $10^{15}$ cm$^{-3}$ order fluctuation of concentration. Therefore, the influence of the outer circumferential Si contamination concentration $\Delta$ in the in-plane Si concentration distribution becomes significant.

As described above, in the GaN layer 20 where the radius of the top surface 25 is 50 mm or more and the central Si concentration C0 is $4 \times 10^{15}$ cm$^{-3}$ or more and less than $2 \times 10^{16}$ cm$^{-3}$ (and even less than $1 \times 10^{16}$ cm$^{-3}$), the difference in Si concentration between the center and the outer circumference becomes significant resulting from the mixed Si. As described below, the embodiments propose a technique that can suppress such in-plane non-uniformity of the Si concentration compared to comparative embodiments, that is, a technique that can suppress the outer circumferential Si contamination concentration $\Delta$ compared to the comparative embodiments.

As a general tendency, the outer circumferential Si concentration $\Delta$ increases as the GaN layer 20 becomes thicker. This is because Si-containing deposition 230 deposited on susceptor edge top surface 213, is increased as the growth time of the GaN layer 20 increases.

The comparative embodiment (and embodiment) exemplifies the outer circumferential Si concentration $\Delta$ in the GaN layer 20 with a thickness of 4 μm. When the thickness of the GaN layer 20 is sufficiently thin, there is a possibility that the contamination of Si resulting from the Si-containing deposition 230 will not be sufficient to cause the in-plane non-uniformity as described above. However, when growing the GaN layer 20 with a thickness of 4 μm (or more), the above-described in-plane non-uniformity will occur. As explained below, the embodiment proposes a technique that can reduce the outer circumferential Si contamination concentration $\Delta$ in the 4 μm thick GaN layer 20 compared to the comparative embodiment, and proposes a technique that can similarly reduce the outer circumferential Si contamination concentration $\Delta$ even in the GaN layer 20 thicker than 4 μm.

Figure 3:
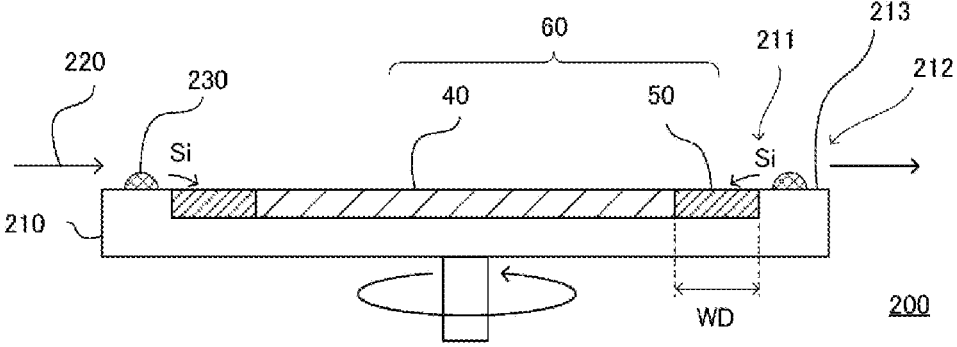
FIG. 3 is a schematic side view illustrating an apparatus for manufacturing the GaN layer according to an embodiment.

The embodiment will be further described. FIG. 3 is a schematic side view illustrating an apparatus 200 for manufacturing the GaN layer 20 according to the embodiment. The manufacturing apparatus 200 according to the embodiment is a horizontal flow type MOVPE apparatus, similarly to the comparative embodiment.

In the embodiment, the GaN layer 20 is grown with an annular dummy wafer 50 placed outside the wafer 40 in plan view. The dummy wafer 50 has a radial width WD and the same thickness as the wafer 40. As a material for the dummy wafer 50 (dummy underlying substrate) at the start of growth of the GaN layer 20, a material used as a base for epitaxially growing GaN, such as GaN, or sapphire, for example, is used. After the growth of the GaN layer 20 starts, the dummy wafer 50 is a structure in which the grown GaN layer is laminated on a dummy underlying substrate.

An entire wafer 60 is a structure including the wafer 40 and the dummy wafer 50. In the embodiment, the entire wafer 60 is an object to be processed by the manufacturing apparatus 200. The edge of the entire wafer 60, that is, the position where the outer circumferential edge of the dummy wafer 50 is arranged, is the susceptor inner circumferential edge 211.

In the embodiment, by arranging the dummy wafer 50 outside the wafer 40, Si released from the Si-containing deposition 230 is preferentially mixed into GaN grown on the dummy wafer 50. Si released from the Si-containing deposition 230 and exceeding the width WD of the dummy wafer 50 mixes into the GaN layer 20 of the wafer 40. In this way, by using the dummy wafer 50, Si mixed into the GaN layer 20 from the Si-containing deposition 230 can be reduced, compared to the comparative embodiment.

Next, a first example of the embodiment will be described. The first example of the embodiment shows an embodiment in which the width WD of the dummy wafer 50 is 10 mm. The growth conditions for the GaN layer 20 in the first example of the embodiment are the same as in the above-described comparative embodiment.

Figure 4:
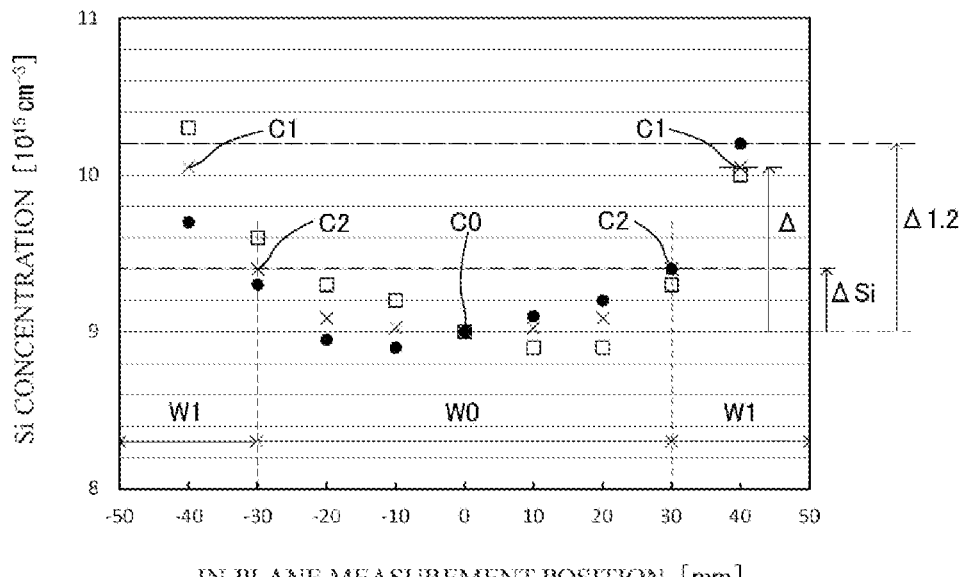
FIG. 4 is a graph showing an example of the Si concentration distribution in a top surface of the GaN layer according to a first example of the embodiment.

FIG. 4 is a graph showing an example of the Si concentration distribution in the top surface 25 of the GaN layer 20 in the first example of the embodiment. The contamination of Si on the outer circumferential side is also observed in the first example of the embodiment as in the comparative embodiment, but it is suppressed more than in the comparative embodiment.

In the first example of the embodiment, specifically, the central Si concentration C0 is $9.00 \times 10^{15}$ cm$^{-3}$. The outer circumferential Si concentration C1 is $10.05 \times 10^{15}$ cm$^{-3}$. The outer circumferential Si contamination concentration $\Delta$ is $1.05 \times 10^{15}$ cm$^{-3}$, which is suppressed compared to the outer circumferential Si contamination concentration $41.64 \times 10^{15}$ cm$^{-3}$ in the comparative embodiment.

A first concentration reference value is set to $1.2 \times 10^{15}$ cm$^{-3}$ as a reference value for the Si concentration lower than the outer circumferential Si contamination concentration $\Delta 1.64 \times 10^{15}$ cm$^{-3}$ of the comparative embodiment. The outer circumferential Si contamination concentration $\Delta$ in the first example of the embodiment is suppressed to a first concentration reference value of $1.2 \times 10^{15}$ cm$^{-3}$ or less. In FIG. 4 (and FIG. 9), the first concentration reference value is shown as $\Delta 1.2$.

Figure 5:
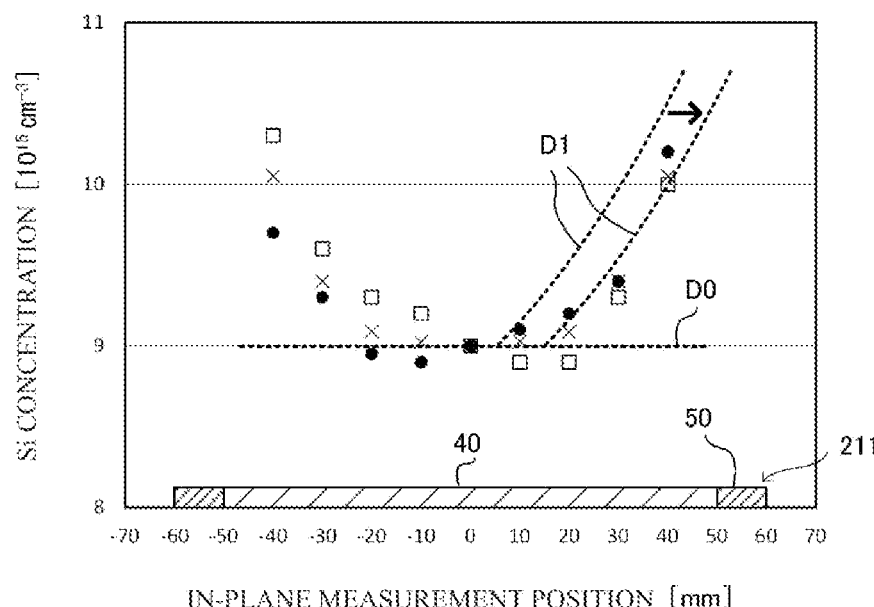
FIG. 5 is a graph schematically showing the Si concentration distribution according to the first example, similar to FIG. 4.

FIG. 5 is a graph schematically showing the Si concentration distribution in the first example of the embodiment, similar to FIG. 4. In order to facilitate understanding, FIG. 5 illustrates the wafer 40, the dummy wafer 50, and the susceptor inner circumferential edge 211 along with the Si concentration distribution.

The contamination distribution D1 in the comparative embodiment is shown on the center side of the wafer 40, and the contamination distribution D1 in the first example of the embodiment is shown on the outer circumferential side of the wafer 40. The dummy wafer 50 has the function of moving the susceptor inner circumferential edge 211 further away from the outside of the wafer 40, compared to the comparative embodiment. Thereby, the contamination distribution D1 can be moved toward the outer circumferential side of the wafer 40 by 10 mm width of the dummy wafer 50, compared to the comparative embodiment. In this way, in the first example of the embodiment, the concentration of the mixed Si can be suppressed to a lower level on the tail side of the contamination distribution D1, compared to the comparative embodiment.

Next, a second example of the embodiment will be described. The second example of the embodiment shows an embodiment in which the width WD of the dummy wafer 50 is 20 mm. The growth conditions for the GaN layer 20 in the second example of the embodiment are similar to those of the above-described comparative example (or the first example of the embodiment).

Figure 6:
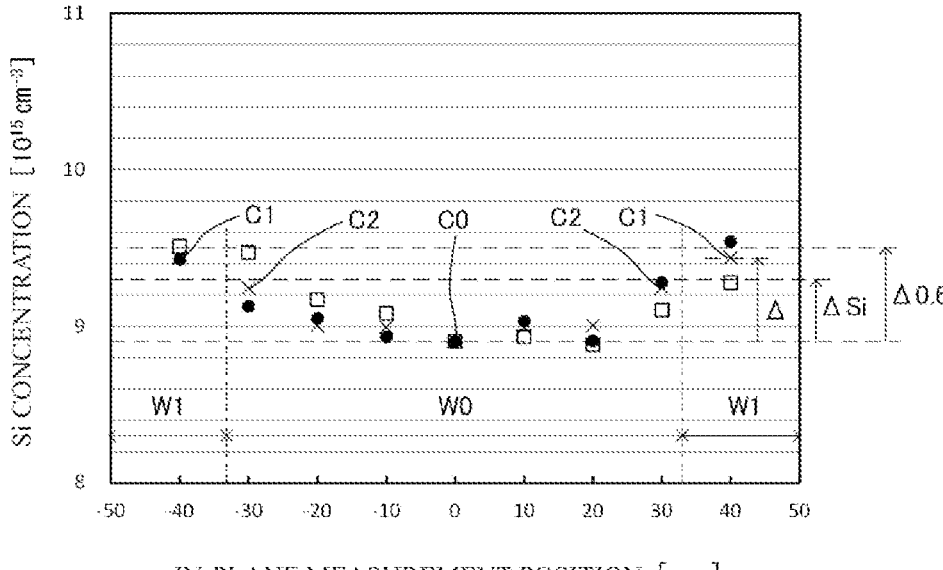
FIG. 6 is a graph showing an example of the Si concentration distribution in the top surface of the GaN layer according to a second example of the embodiment.

FIG. 6 is a graph showing an example of the Si concentration distribution in the top surface 25 of the GaN layer 20 in the second example of the embodiment. The contamination of Si on the outer circumferential side is also observed in the second example of the embodiment as in the comparative embodiment and the first example of the embodiment, but it is further suppressed than in the first example of the embodiment.

In the second example of the embodiment, specifically, the central Si concentration C0 is $8.91 \times 10^{15}$ cm$^{-3}$. The outer circumferential Si concentration C1 is $9.44 \times 10^{15}$ cm$^{-3}$. The outer circumferential Si contamination concentration $\Delta$ is $0.53 \times 10^{15}$ cm$^{-3}$, which is further suppressed than the outer circumferential Si contamination concentration $41.05 \times 10^{15}$ cm$^{-3}$ of the first example of the embodiment.

A second concentration reference value and a third concentration reference value, which are lower than the first concentration reference value $1.2 \times 10^{15}$ cm$^{-3}$, are $0.9 \times 10^{15}$ cm$^{-3}$ and $0.6 \times 10^{15}$ cm$^{-3}$, respectively. Similarly to the first example of the embodiment, the outer circumferential Si contamination concentration $\Delta$ in the second example of the embodiment is also suppressed to the first concentration reference value of $1.2 \times 10^{15}$ cm$^{-3}$ or less. The outer circumferential Si contamination concentration $\Delta$ in the second example of the embodiment is preferably suppressed to the second concentration reference value of $0.9 \times 10$ cm$^{-3}$ or less, and more preferably suppressed to the third concentration reference value of $0.6 \times 10^{15}$ cm$^{-3}$ or less. In FIG. 6, the third concentration reference value is shown as $\Delta 0.6$.

Figure 7:
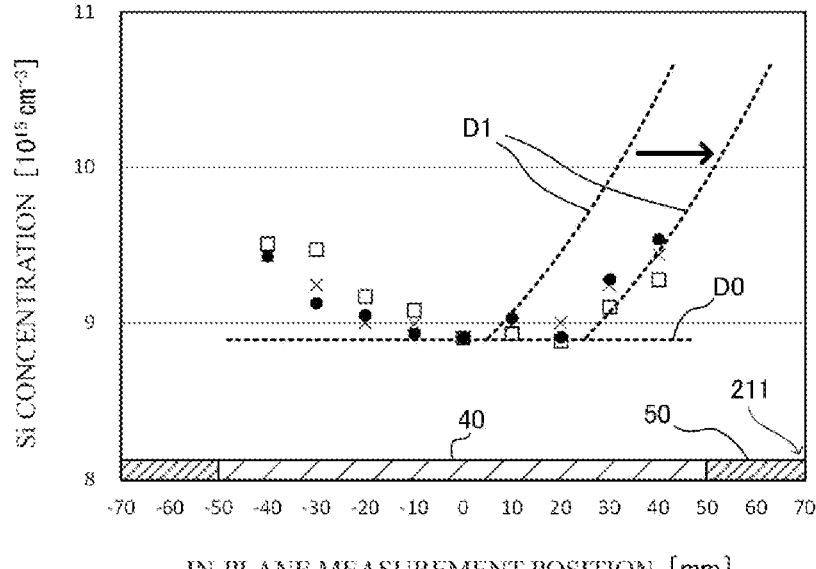
FIG. 7 is a graph schematically showing the Si concentration distribution according to the second example, similar to FIG. 6.

FIG. 7 is a graph schematically showing the Si concentration distribution of the second example of the embodiment, similar to FIG. 6. In order to facilitate understanding, FIG. 7 illustrates the wafer 40, the dummy wafer 50, and the susceptor inner circumferential edge 211 along with the Si concentration distribution.

The contamination distribution D1 in the comparative embodiment is shown on the center side of the wafer 40, and the contamination distribution D1 in the second example of the embodiment is shown on the outer circumferential side of the wafer 40. In the second example of the embodiment, the contamination distribution D1 can be moved toward the outer circumferential side of the wafer 40 by 20 mm of the width of the dummy wafer 50, compared to the comparative embodiment. In this way, in the second example of the embodiment, the concentration of the mixed Si can be suppressed to a lower level further toward the tail side of the contamination distribution D1, compared to the first example of the embodiment.

As in the second example, by increasing the width WD of the dummy wafer 50, the contamination of Si on the outer circumferential side of the wafer 40 can be further suppressed. However, increasing the width WD of the dummy wafer 50 increases the area of the entire wafer 60, that is, increases the area of the GaN layer to be grown.

The lateral flow type MOVPE apparatus has a characteristic that a raw material efficiency (ratio of the raw material contributing to growth) decreases as the area of the GaN layer to be grown becomes larger. In the embodiment, since a thick GaN layer 20 with a thickness of 4 μm or more is grown, a decrease in the raw material efficiency leads to a decrease in production efficiency and an increase in cost. Further, as the growth area becomes larger, a problem such as an exhaustion of the raw material on the downstream side become more likely to occur.

Accordingly, from a viewpoint of growing the GaN layer 20 on the wafer 40 favorably, the area of the entire wafer 60, that is, the width WD of the dummy wafer 50, is preferably as small as possible within a range where the effect of suppressing the contamination of Si can be appropriately obtained.

Therefore, the width WD of the dummy wafer 50 is not increased so excessively that the outer circumferential Si concentration $\Delta$ becomes zero. Specifically, the width WD of the dummy wafer 50 is kept to a size such that the outer circumferential Si contamination concentration $\Delta$ is equal to or higher than the fourth concentration reference value of $0.3 \times 10^{15}$ cm$^{-3}$, when the fourth concentration reference value is $0.3 \times 10^{15}$ cm$^{-3}$.

In this way, in the embodiment, the outer circumferential Si contamination concentration $\Delta$ is suppressed by using the dummy wafer 50, but the outer circumferential Si contamination concentration $\Delta$ is not reduced to zero. That is, the following characteristic remains: the outer circumferential Si concentration C1 is higher than the central Si concentration C0. Specifically, the outer circumferential Si contamination concentration Δ is suppressed to the first concentration reference value of $1.2×10$ cm$^{-3}$ or less, preferably suppressed to the second concentration reference value of $0.9×10$ cm$^{-3}$ or less, and more preferably suppressed to the third concentration reference value of $0.6×10^{15}$ cm$^{-3}$ or less. However, the outer circumferential Si contamination concentration Δ is equal to or higher than the fourth concentration reference value of $0.3×10^{15}$ cm$^{-3}$.

When specifying that "the outer circumferential Si concentration C1 is higher than the central Si concentration C0", it is so defined that not only the first condition that the value of the outer circumferential Si concentration C1 is larger than the value of the central Si concentration C0 is satisfied, but also the second condition described below is satisfied.

The outer circumferential Si concentration C1 is the average value at four outer circumferential measurement points. When considering only the average value, for example (virtually) the following in appropriate situation may occur: although the Si concentration at three circumferential measurement points is lower than the central Si concentration C0, the average value, that is, the outer circumferential Si concentration C1 is higher than the central Si concentration C0, due to a variation such that the Si concentration is extremely high at one circumferential measurement point.

In the embodiment, as described above, the GaN layer 20 is grown while being rotated so as to achieve uniformity in the circumferential direction. Therefore, it is preferable to have a definition that also takes into consideration the uniformity in the circumferential direction. Here, when specifying that "the outer circumferential Si concentration C1 is higher than the central Si concentration C0", the condition such the Si concentration at at least three (preferably four) of the four circumferential measurement points is higher than the central Si concentration C0, is also satisfied as an additional second condition.

In the above description, an example is given in which the thickness of the GaN layer 20 is 4 μm. As described above, the longer the growth time of the GaN layer 20, that is, the thicker the GaN layer 20, the Si-containing deposition 230 is likely to increase. Therefore, when the width WD of the dummy wafer 50 is kept constant, the thicker the GaN layer 20 is, the larger the outer circumferential Si concentration Δ becomes.

Therefore, in the embodiment in which the thickness of the GaN layer 20 is thicker than 4 μm, it is preferable to increase the width WD of the dummy wafer 50 appropriately according to the thickness of the GaN layer 20, compared to the embodiment in which the thickness of the GaN layer 20 is 4 μm, so that the outer circumferential Si contamination concentration Δ is reduced to a specified value. In this way, by appropriately increasing the width WD of the dummy wafer 50 according to the thickness of the GaN layer 20, the outer circumferential Si contamination concentration Δ can be reduced to a specified value even in the embodiment in which the thickness of the GaN layer 20 is thicker than 4 μm.

Hereinafter, the characteristics of the GaN layer 20 according to the embodiment will be further explained. As described above, in the embodiment, by using the dummy wafer 50, the outer circumferential Si contamination concentration Δ is suppressed. Thereby, the region where the concentration of the mixed Si is low on the center side of the top surface 25 of the GaN layer 20 can be expanded toward the outer circumferential side than in the comparative embodiment. In other words, the width of the region with a high concentration of the mixed Si on the outer circumferential side in the top surface 25 of the GaN layer 20, can be made smaller than that of the comparative embodiment.

The region where the concentration of the mixed Si exceeds $0.4×10^{15}$ cm$^{-3}$, thereby causing 10% higher Si concentration than the lower limit $4×10^{15}$ cm$^{-3}$ of a target doping concentration, which is the lower limit of the central Si concentration C0, is called a high Si contamination concentration region. In FIG. 4 and the like, the Si concentration ($0.4×10^{15}$ cm$^{-3}$) is shown as ΔSi. The high Si contamination concentration region is an annular region on the edge side of the top surface 25 of the GaN layer 20. (The entire region of) the circular region inside the annular region which is the high Si contamination concentration region is a low Si contamination concentration region. The width from the edge of the top surface 25 of the annular region which is the high Si contamination concentration region is W1, and a diameter of the circular region which is the low Si contamination concentration region is W0.

The width W1 of the high Si contamination concentration region is approximately 30 mm in the comparative embodiment (FIG. 9), while it is approximately 20 mm in the first example (FIG. 4) and second example (FIG. 6) of the embodiment. It is getting smaller and smaller. The width W1 in the second example is even smaller than the width W1 in the first example. The width W1 of the high Si contamination concentration region in the first example and the second example of the embodiment is suppressed to 20 mm or less.

In this way, in the GaN layer 20 of the embodiment, in (the entire area of) the circular region inside the annular region with a width of 20 mm from the edge of the top surface 25, it is characterized in that the concentration of the mixed Si (the excess of the average Si concentration from the central Si concentration C0) is $0.4×10^{15}$ cm$^{-3}$ or less.

In the embodiment (and comparative embodiment), the concentration of the mixed Si schematically decreases monotonically from the outer circumferential side of the GaN layer 20 toward the center side. Therefore, the GaN layer 20 of the embodiment is characterized in that the intermediate Si concentration C2 at a radial position between the center and the outer circumference is higher than the central Si concentration C0 and lower than the outer circumferential Si concentration C1.

The intermediate Si concentration C2 is, for example, the average Si concentration at a radial position 30 mm from the center. In the first example of the embodiment illustrated in FIG. 4, the intermediate Si concentration C2 ($9.40×10^{15}$ cm$^{-3}$) is higher than the central Si concentration C0 ($9.00×10^{15}$ cm$^{-3}$), and lower than the outer circumferential Si concentration C1 ($10.05×10^{15}$ cm$^{-3}$). Further, in the second example of the embodiment illustrated in FIG. 6, the intermediate Si concentration C2 ($9.25×10^{15}$ cm$^{-3}$) is higher than the central Si concentration C0 ($8.91×10^{15}$ cm$^{-3}$) and lower than the outer circumferential Si concentration C1 ($9.44×10^{15}$ cm$^{-3}$).

Preferable Aspects of the Present Invention

Hereinafter, preferable aspects of the present invention will be supplementarily described.

Supplementary Description 1

A multilayered substrate, including:
an underlying substrate; and a gallium nitride layer epitaxially grown above the underlying substrate and comprising gallium nitride containing silicon;

the gallium nitride layer having a top surface with a radius of 50 mm or more, the gallium nitride layer having a thickness of 4 μm or more, wherein a silicon concentration in the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and an outer circumferential silicon contamination concentration, which is an excess of the outer circumferential silicon concentration from the central silicon concentration, is $1.2 \times 10^{15}$ cm$^{-3}$ or less (preferably $0.9 \times 10^{15}$ cm$^{-3}$ or less, more preferably $0.6 \times 10^{15}$ cm$^{-3}$ or less).

Supplementary Description 2

The multilayered substrate according to supplementary description 1, wherein in a circular region inside an annular region with a width of 20 mm from an edge of the top surface, the excess of the silicon concentration in the top surface of the gallium nitride layer from the central silicon concentration, is $0.4 \times 10^{15}$ cm$^{-3}$ or less.

Supplementary Description 3

The multilayered substrate according to supplementary description 1 or 2, wherein the silicon concentration in the top surface of the gallium nitride layer has a distribution in which an intermediate silicon concentration at a radial position 30 mm from a center of the top surface is higher than the central silicon concentration and lower than the outer circumferential silicon concentration.

What is claimed is:

1. A multilayered substrate, comprising:

an underlying substrate; and a gallium nitride layer epitaxially grown above the underlying substrate and comprising gallium nitride containing silicon;

the gallium nitride layer having a top surface with a radius of 50 mm or more, the gallium nitride layer having a thickness of 4 μm or more, wherein a silicon concentration in the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and an outer circumferential silicon contamination concentration, which is an excess of the outer circumferential silicon concentration from the central silicon concentration, is $1.2 \times 10^{15}$ cm$^{-3}$ or less.

2. The multilayered substrate according to claim 1, wherein in a circular region inside an annular region with a width of 20 mm from an edge of the top surface, the excess of the silicon concentration in the top surface of the gallium nitride layer from the central silicon concentration, is $0.4 \times 10^{15}$ cm$^{-3}$ or less.

3. The multilayered substrate according to claim 1, wherein the silicon concentration in the top surface of the gallium nitride layer has a distribution in which an intermediate silicon concentration at a radial position 30 mm from a center of the top surface is higher than the central silicon concentration and lower than the outer circumferential silicon concentration.

* * * * *